United States Patent
Li et al.

(10) Patent No.: US 12,494,741 B2
(45) Date of Patent: Dec. 9, 2025

(54) VOLTAGE CONTROLLED OSCILLATOR, SYSTEM CIRCUIT, AND CONTROL METHOD THEREOF

(71) Applicant: Bestechnic (Shanghai) Co., Ltd., Shanghai (CN)

(72) Inventors: Ling Li, Shanghai (CN); Lu Chai, Shanghai (CN)

(73) Assignee: BESTECHNIC (SHANGHAI) CO., LTD., Shanghai (CN)

( * ) Notice: Subject to any disclaimer, the term of this patent is extended or adjusted under 35 U.S.C. 154(b) by 14 days.

(21) Appl. No.: 18/537,942

(22) Filed: Dec. 13, 2023

(65) Prior Publication Data
US 2024/0388250 A1  Nov. 21, 2024

Related U.S. Application Data

(63) Continuation of application No. PCT/CN2023/105851, filed on Jul. 5, 2023.

(30) Foreign Application Priority Data

May 16, 2023  (CN) .......... 202310553864.5

(51) Int. Cl.
*H03B 5/12* (2006.01)

(52) U.S. Cl.
CPC ............. *H03B 5/1212* (2013.01); *H03B 5/12* (2013.01); *H03B 5/1228* (2013.01); *H03B 5/1243* (2013.01); *H03B 2200/0072* (2013.01)

(58) Field of Classification Search
CPC .......... H03B 5/1212; H03B 2200/0072; H03B 5/1215; H03B 5/1228; H03B 5/1243
USPC .......................... 331/2, 16, 34, 117 FE, 167
See application file for complete search history.

(56) References Cited

U.S. PATENT DOCUMENTS

| | | | | |
|---|---|---|---|---|
| 8,058,934 | B2* | 11/2011 | Rangarajan | H03B 21/00 331/46 |
| 10,447,204 | B2* | 10/2019 | Moslehi Bajestan | H03B 5/1215 |
| 2012/0068777 | A1* | 3/2012 | Rangarajan | H03B 21/00 331/117 R |
| 2016/0373057 | A1* | 12/2016 | Farazian | H03B 27/00 |

\* cited by examiner

*Primary Examiner* — Arnold M Kinkead
(74) *Attorney, Agent, or Firm* — Bayes PLLC

(57) ABSTRACT

In certain aspects, a voltage controlled oscillator (VCO), a system circuit, and a control method thereof are disclosed. The VCO includes a first oscillator circuit and a second oscillator circuit. The first oscillator circuit includes a first inductor. The second oscillator circuit includes a second inductor. The first inductor is embedded inside the second inductor so that a total mutual inductance between the first and second inductors is smaller than or equal to a predetermined threshold.

17 Claims, 8 Drawing Sheets

VOLTAGE CONTROLLED OSCILLATOR, SYSTEM CIRCUIT, AND CONTROL METHOD THEREOF

CROSS-REFERENCE TO RELATED APPLICATIONS

This application is a continuation of International Application No. PCT/CN2023/105851, filed on Jul. 5, 2023, which claims the benefit of priority to Chinese Patent Application No. 202310553864.5, filed on May 16, 2023, both of which are incorporated herein by reference in its entirety.

BACKGROUND

The present disclosure relates to a voltage controlled oscillator (VCO), a system circuit, and a control method thereof.

A VCO may be designed to produce an output signal whose frequency can vary over a range of frequencies based on a voltage amplitude of an input signal. The VCO can be used in a phase-locked loop (PLL), a frequency modulator, a phase modulator, a radar, or other electronic systems. For example, the VCO can be used in a system on chip (SoC) which integrates a digital modem, a radio frequency (RF) transceiver, etc., on a single chip.

SUMMARY

According to one aspect of the present disclosure, a VCO is disclosed. The VCO includes a first oscillator circuit and a second oscillator circuit. The first oscillator circuit includes a first inductor. The second oscillator circuit includes a second inductor. The first inductor is embedded inside the second inductor so that a total mutual inductance between the first and second inductors is smaller than or equal to a predetermined threshold.

According to another aspect of the present disclosure, a method for controlling a VCO which includes a first oscillator circuit and a second oscillator circuit is disclosed. The first oscillator circuit includes a first inductor. The second oscillator circuit includes a second inductor. The method includes controlling, at a transmit mode, an operation of the first oscillator circuit to provide a TX local oscillator signal for data transmission. The first inductor is configured to implement a first resonant frequency selection network for the first oscillator circuit at the transmit mode, and the first inductor is embedded inside the second inductor so that a total mutual inductance between the first and second inductors is smaller than or equal to a predetermined threshold. The method also includes controlling, at a receive mode, an operation of the second oscillator circuit to provide a RX local oscillator signal for data transmission. The second inductor is configured to implement a second resonant frequency selection network for the second oscillator circuit at the receive mode.

According to yet another aspect of the present disclosure, a system circuit is disclosed. The system circuit includes a communication unit configured for data communication with an external communication network. The communication unit includes a VCO which includes a first oscillator circuit and a second oscillator circuit. The first oscillator circuit includes a first inductor. The second oscillator circuit includes a second inductor. The first inductor is embedded inside the second inductor so that a total mutual inductance between the first and second inductors is smaller than or equal to a predetermined threshold.

BRIEF DESCRIPTION OF THE DRAWINGS

The accompanying drawings, which are incorporated herein and form a part of the specification, illustrate aspects of the present disclosure and, together with the description, further serve to explain the principles of the present disclosure and to enable a person skilled in the pertinent art to make and use the present disclosure.

Figure 1A:
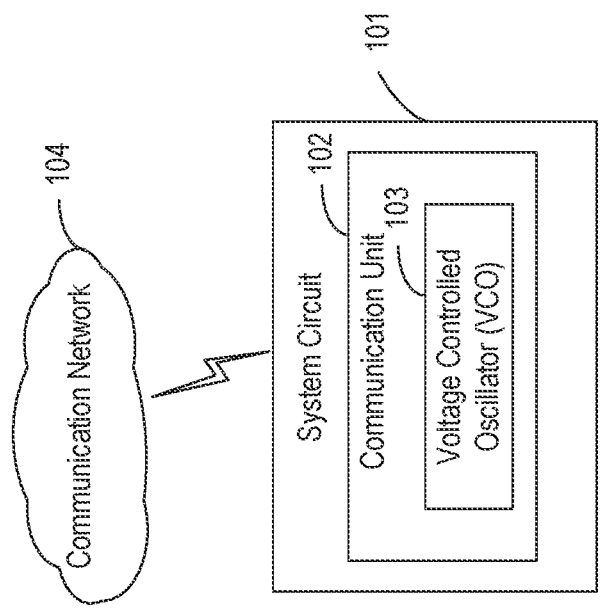
FIG. 1A illustrates a block diagram of an example system circuit including a communication unit, according to some aspects of the present disclosure.

The present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present disclosure.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

In some applications, a VCO can be used in a RF transceiver which is embedded in an SoC. When the RF transceiver operates in a transmitting mode, a power amplifier (PA) with high output power may cause pulling on the VCO. Due to the pulling, the VCO may consume more power in order to oscillate in a high frequency. There are various methods to reduce the pulling on the VCO. In a first example, the frequency of the VCO can be designed at the frequency of an even harmonic, such as the $2^{nd}$ or $4^{th}$ harmonic. Then, a frequency division processing can be performed on the output frequency of the VCO to generate respective local oscillator frequencies needed for RF transmission and reception. In this case, when the RF transceiver operates in the transmitting mode, the power consumption of the VCO is small. However, when the RF transceiver operates in a receiving mode, the VCO that produces the frequency of the $4^{th}$ harmonic may cause large power consumption. In a second example, the RF transceiver may include both a high-frequency VCO and a low-frequency VCO, where the high-frequency VCO is used to generate a local oscillator frequency for signal transmission, and the low-frequency VCO is used to generate another local oscillator frequency for signal reception. However, the configuration of two VCOs (e.g., the high-frequency VCO and the low-frequency VCO) may increase a circuit area of the RF transceiver, thereby increasing the cost of the SoC.

To address one or more of the above-mentioned issues, a VCO including a first oscillator circuit and a second oscillator circuit is disclosed herein. During a transmit mode (e.g., when the RF transceiver operates in the transmitting mode), the first oscillator circuit may be configured to implement the high-frequency transmission. During a receive mode (e.g., when the RF transceiver operates in the receiving mode), the second oscillator circuit may be configured to implement the low-frequency reception. As a result, the power consumption of the RF transceiver (and the SoC) can be reduced in both the transmit mode and the receive mode.

Furthermore, the first oscillator circuit may include a first inductor, and the second oscillator circuit may include a second inductor, where the first inductor can be embedded (e.g., nested) inside the second inductor. In this case, the circuit area does not increase even though two inductors (e.g., the first inductor and the second inductor) are included in the VCO. By configuring the winding manners of the first inductor and the second inductor, a total mutual inductance between the first and second inductors can be smaller than or equal to a predetermined threshold (e.g., the total mutual inductance approaches zero). As a result, a coupling coefficient between the first and second inductors can be smaller than or equal to a coupling threshold (e.g., the coupling coefficient also approaches zero). The quality factors (Q) of the first and second inductors are almost not changed even though the first and second inductors are embedded together. The performance of the VCO is improved with low power consumption. Since the first and second inductors are embedded together, the circuit area of the SoC can be reduced.

FIG. 1A illustrates a block diagram of an example system circuit 101 including a communication unit 102, according to some aspects of the present disclosure. In some implementations, system circuit 101 can be an SoC. System circuit 101 may transmit or receive signals to or from an external communication network 104 through communication unit 102. Communication network 104 can include any suitable network, such as a wide area network (WAN), a local area network (LAN), a Bluetooth network, a cellular network, etc.

Communication unit 102 may include a VCO 103. At a transmit mode (e.g., when communication unit 102 operates in a transmitting mode), VCO 103 may be configured to provide a transmitter (TX) local oscillator signal for data transmission. The TX local oscillator signal may have a first local oscillator frequency which can be changed over a first range of frequencies. At a receive mode (e.g., when communication unit 102 operates in a receiving mode), VCO 103 may be configured to provide a receiver (RX) local oscillator signal. The RX local oscillator signal may have a second local oscillator frequency which can be changed over a second range of frequencies. An example of communication unit 102 can be a RF transceiver, which is illustrated below in more detail with reference to FIG. 1B.

Figure 1B:
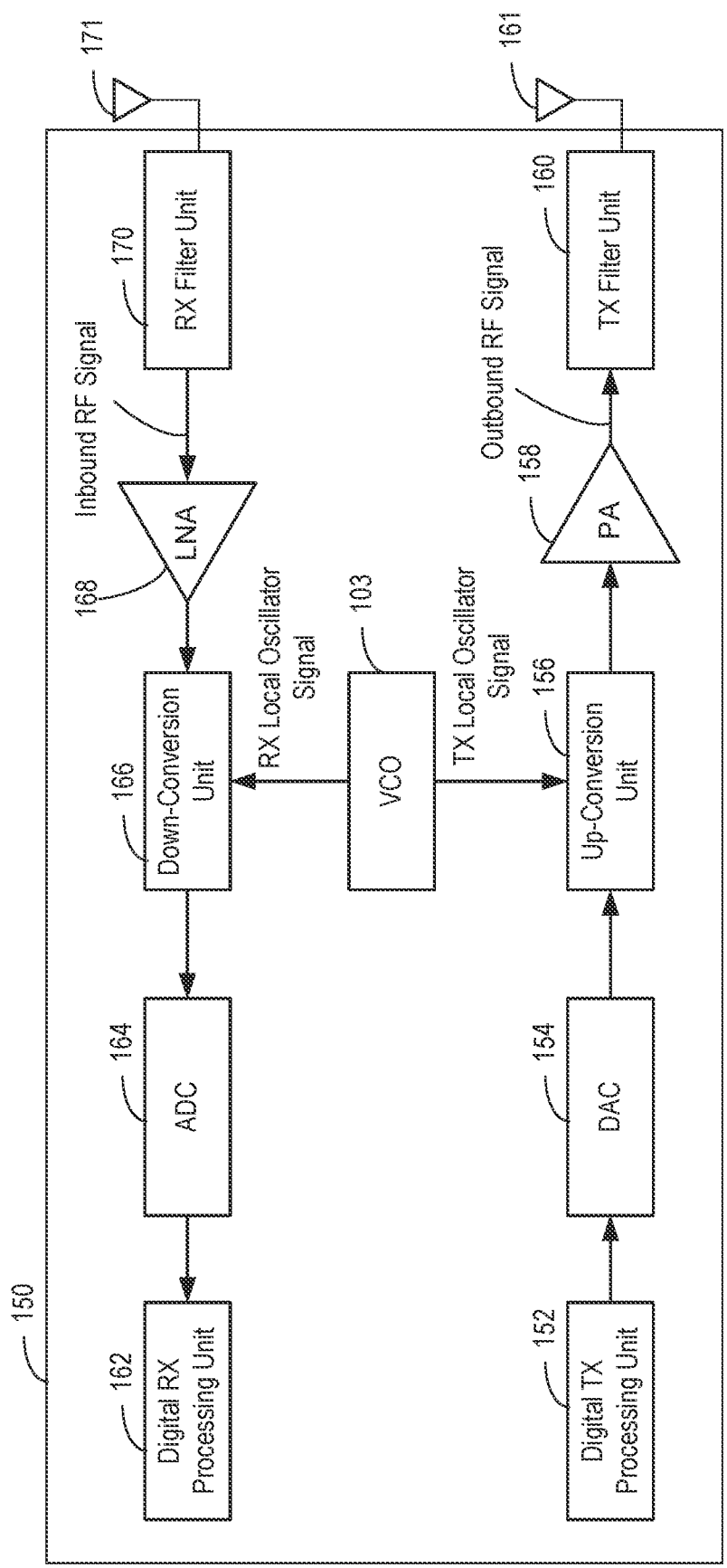
FIG. 1B illustrates a block diagram of an example communication unit, according to some aspects of the present disclosure.

FIG. 1B illustrates a block diagram of an example communication unit, according to some aspects of the present disclosure. The example communication unit can be a RF transceiver 150. RF transceiver 150 may include VCO 103. At a transmit mode. VCO 103 may be configured to provide a TX local oscillator signal for data transmission. At a receive mode, VCO 103 may be configured to provide a RX local oscillator signal.

RF transceiver 150 may further include a digital TX processing unit 152, a digital-to-analog converter (DAC) 154, an up-conversion unit 156, a power amplifier 158, a TX filter unit 160, an antenna 161, a digital RX processing unit 162, an analog-to-digital converter (ADC) 164, an down-conversion unit 166, a low noise amplifier (LNA) 168, a RX filter unit 170, and an antenna 171. In some implementations, antennas 161 and 171 may be integrated into a single antenna. It is understood that RF transceiver 150 may also include other components not shown in FIG. 1B, which is not limited herein.

In the operation of the transmitting mode, RF transceiver 150 may receive outbound data (e.g., data to be transmitted) from a host device (not shown in FIG. 1B). Digital TX processing unit 152 may process the outbound data in accordance with a wireless communication protocol (e.g., IEEE 802.11(a), IEEE 802.11(b), Bluetooth, etc.) to generate TX digital data. The TX digital data can be, for example, a digital baseband signal. DAC 154 may convert the TX digital data from the digital domain to the analog domain to generate a TX analog signal. Up-conversion unit 156 may convert the TX analog signal into a RF signal based on the TX local oscillator signal provided by VCO 103. Power amplifier 158 may amplify the RF signal to produce an outbound RF signal. TX filter unit 160 may filter the outbound RF signal and send the filtered outbound RF signal to antenna 161. Antenna 161 may transmit the filtered outbound RF signal to a target device such as a base station, an access point, or another wireless communication device through a communication network (e.g., communication network 104 of FIG. 1A).

In the operation of the receiving mode, RF transceiver 150 may receive an inbound RF signal via antenna 171. RX filter unit 170 may filter the inbound RF signal using a bandpass filter to generate a filtered inbound RF signal. LNA 168 may amplify the filtered inbound RF signal to generate an amplified inbound RF signal. Down-conversion unit 166 may convert the amplified inbound RF signal into a RX analog signal based on the RX local oscillator signal provided by VCO 103. ADC 164 may convert the RX analog signal from the analog domain to the digital domain to generate RX digital data. The RX digital data can be, for example, a digital baseband signal. Digital RX processing unit 162 may process the RX digital data to recapture inbound data (e.g., data to be received). For example, digital RX processing unit 162 may decode, descramble, and/or demodulate the RX digital data to recapture the inbound data.

Figure 2A:
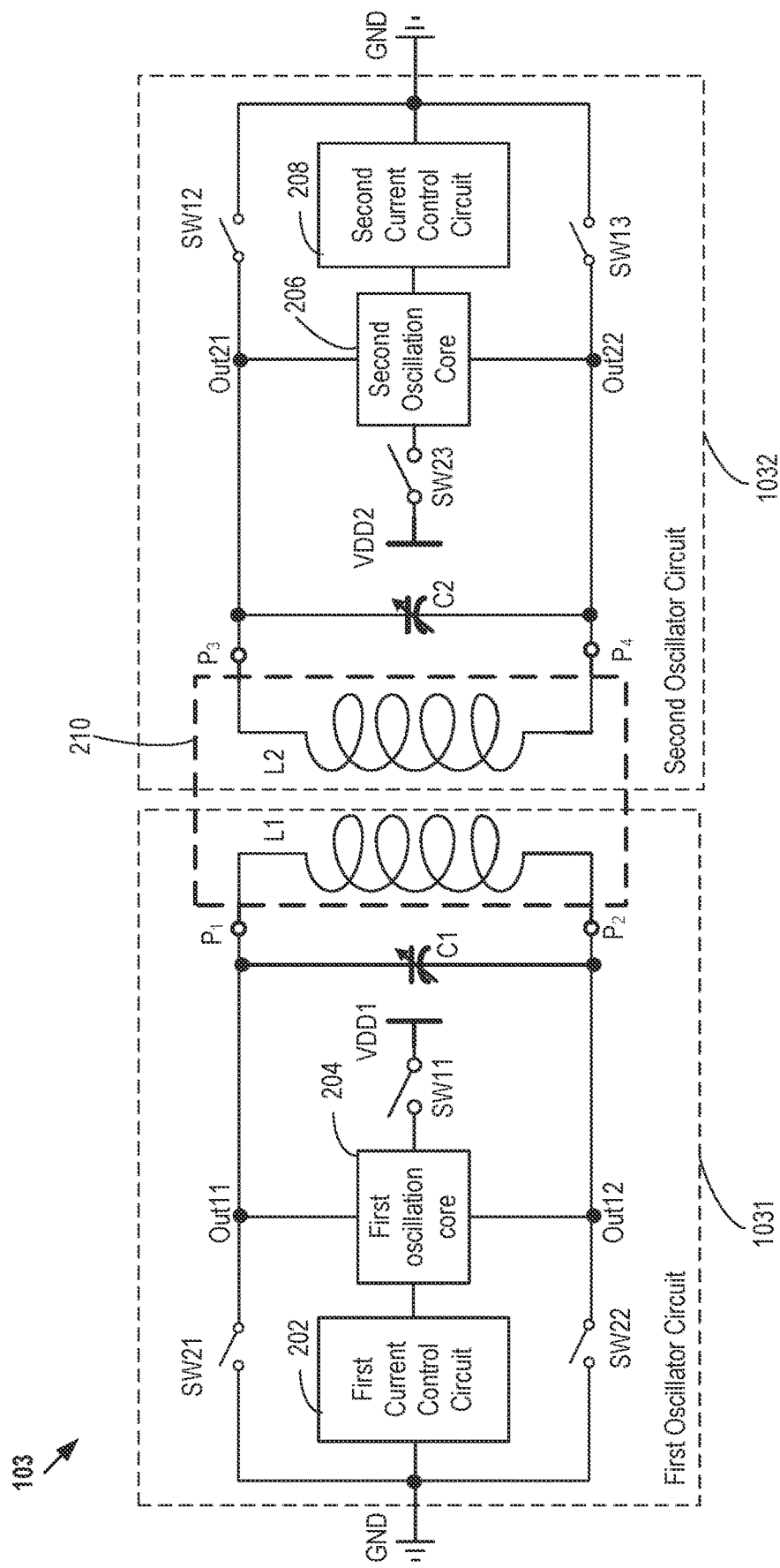
FIG. 2A illustrates a block diagram of an example VCO, according to some aspects of the present disclosure.

FIG. 2A illustrates a block diagram of an example VCO (e.g., VCO 103), according to some aspects of the present disclosure. VCO 103 may include a first oscillator circuit 1031 and a second oscillator circuit 1032. First oscillator circuit 1031 may be a high-frequency oscillator circuit for generating a TX local oscillator signal for data transmission. Second oscillator circuit 1032 may be a low-frequency oscillator circuit for generating a RX local oscillator signal.

First oscillator circuit 1031 may include a first current control circuit 202, a first oscillation core 204, and a first energy storage circuit. The first energy storage circuit may include a first variable capacitor C1 and a first inductor L1. The first variable capacitor C1 may be connected in parallel with the first inductor L1. For example, a first end and a second end of the first variable capacitor C1 may be electrically coupled to a first output end Out11 and a second output end Out12 of first oscillator circuit 1031, respectively. A first end and a second end of the first inductor L1 may also be electrically coupled to the first output end Out11 and the second output end Out12 of first oscillator circuit 1031, respectively. The first variable capacitor C1 may be a diode with variable capacitance, a microelectromechanical (MEM) capacitor, any other electronic tunable capacitor, or any other digital tunable capacitor. The first inductor L1 may be a magnetically-coupled inductor, a transformer, or any other inductor with a magnetically-coupled configuration.

First oscillation core 204 may be electrically coupled to the first output end Out11 and the second output end Out12 of first oscillator circuit 1031. First oscillation core 204 can be an active oscillation core. First oscillation core 204 is illustrated below in more detail with reference to FIG. 2B. A first end and a second end of first current control circuit 202 may be electrically coupled to first oscillation core 204 and ground (GND), respectively. First current control circuit 202 can be, for example, a current source.

In some implementations, first oscillation core 204 may be electrically coupled to a first power supply VDD1 through a first switch of a first type (SW11). The first output end Out11 of first oscillator circuit 1031 may be electrically coupled to the ground through a first switch of a second type (SW21). The second output end Out12 of first oscillator circuit 1031 may be electrically coupled to the ground through a second switch of the second type (SW22).

For example, a first end and a second end of the first switch of the first type SW11 can be connected to first oscillation core 204 and the first power supply VDD1, respectively. A first end and a second end of the first switch of the second type SW21 can be connected to the first output end Out11 of first oscillator circuit 1031 and the ground, respectively. A first end and a second end of the second switch of the second type SW22 can be connected to the second output end Out12 of first oscillator circuit 1031 and the ground, respectively. The first and second ends of the first inductor L1 can also be electrically coupled to the ground through the first switch of the second type SW21 and the second switch of the second type SW22, respectively.

Second oscillator circuit 1032 may have a structure like that of first oscillator circuit 1031. Specifically, second oscillator circuit 1032 may include a second current control circuit 208, a second oscillation core 206, and a second energy storage circuit. The second energy storage circuit may include a second variable capacitor C2 and a second inductor L2. The second variable capacitor C2 may be connected in parallel with the second inductor L2. For example, a first end and a second end of the second variable capacitor C2 may be electrically coupled to a first output end Out21 and a second output end Out22 of second oscillator circuit 1032, respectively. A first end and a second end of the second inductor L2 may also be electrically coupled to the first output end Out21 and the second output end Out22 of second oscillator circuit 1032, respectively. The second variable capacitor C2 may be a diode with variable capacitance, a MEM capacitor, any other electronic tunable capacitor, or any other digital tunable capacitor. The second inductor L2 may be a magnetically-coupled inductor, a transformer, or any other inductor with a magnetically-coupled configuration.

Second oscillation core 206 may be electrically coupled to the first output end Out21 and the second output end Out22 of second oscillator circuit 1032. Second oscillation core 206 can be an active oscillation core. Second oscillation core 206 is illustrated below in more detail with reference to FIG. 2B. A first end and a second end of second current control circuit 208 may be electrically coupled to second oscillation core 206 and the ground (GND), respectively. Second current control circuit 208 can be, for example, a current source.

In some implementations, second oscillation core 206 may be electrically coupled to a second power supply VDD2 through a third switch of the second type (SW32). The first output end Out21 of second oscillator circuit 1032 may be electrically coupled to the ground through a second switch of the first type (SW12). The second output end Out22 of second oscillator circuit 1032 may be electrically coupled to the ground through a third switch of the first type (SW13).

For example, a first end and a second end of the third switch of the second type SW32 can be connected to second oscillation core 206 and the second power supply VDD2, respectively. A first end and a second end of the second switch of the first type SW12 can be connected to the first output end Out21 of second oscillator circuit 1032 and the ground, respectively. A first end and a second end of the third switch of the first type SW13 can be connected to the second output end Out22 of second oscillator circuit 1032 and the ground, respectively. The first and second ends of the second inductor L2 can also be electrically connected to the ground through the second switch of the first type SW12 and the third switch of the first type SW13, respectively.

An operation state of each switch of the first type (e.g., SW11, SW12, SW13) can be opposite to an operation state of each switch of the second type (e.g., SW21, SW22, SW23). For example, when the first switch of the first type SW11, the second switch of the first type SW12, and the third switch of the first type SW13 are closed, the first switch of the second type SW21, the second switch of the second type SW22, and the third switch of the second type SW23 are open. On the other hand, when the first switch of the first type SW11, the second switch of the first type SW12, and the third switch of the first type SW13 are open, the first switch of the second type SW21, the second switch of the second type SW22, and the third switch of the second type SW23 are closed. In some implementations, each switch of the first type can be closed under a high-voltage control signal, whereas each switch of the second type can be closed under a low-voltage control signal. Alternatively, each switch of the first type can be closed under a low-voltage control signal, whereas each switch of the second type can be closed under a high-voltage control signal.

Consistent with some aspects of the present disclosure, first oscillator circuit 1031 can be a high-frequency oscillator circuit for the transmit mode, and second oscillator circuit 1032 can be a low-frequency oscillator circuit for the receive mode. An inductance value of the first inductor L1 can be smaller than an inductance value of the second inductor L2. A capacitance value of the first variable capacitor C1 can be smaller than a capacitance value of the second variable capacitor C2. It is contemplated that the inductance value of the first inductor L1 and the capacitance value of the first variable capacitor C1 can be determined according to a local oscillator frequency needed for the transmit mode, whereas the inductance value of the second inductor L2 and the capacitance value of the second variable capacitor C2 can be determined according to a local oscillator frequency needed for the receive mode.

Consistent with some aspects of the present disclosure, the first inductor L1 can be embedded inside the second inductor L2 to form an integrated inductor set 210 so that a circuit area of VCO 103 can be reduced. The winding manners of the first and second inductors L1, L2 in integrated inductor set 210 can be configured in various ways, such that a total mutual inductance (e.g., M) between the first and second inductors L1, L2 can be smaller than or equal to a predetermined threshold. A coupling coefficient k of the first and second inductors L1, L2 can be smaller than or equal to a coupling threshold (e.g., $k=M/\sqrt{l1*l2} \leq$ the coupling coefficient, where l1 represents the inductance value of the first inductor L1, and l2 represents the inductance value of the second inductor L2). In some implementations, the predetermined threshold of the total mutual inductance M can be zero or any other value close to zero, so that the total mutual inductance M can be zero or a value approaching zero (e.g., M≈0), and the coupling coefficient k of the first and second inductors L1, L2 can be zero or another value approaching zero (e.g., k≈0). Thus, the quality factors of the first inductor L1 and the second inductor L2 are almost unchanged even though the first and second inductors L1, L2 are embedded together, and a phase noise of VCO 103 formed with the first and second inductors L1, L2 is small.

Integrated inductor set 210 may include four ports P1, P2, P3, and P4. For example, a first port P1 and a second port P2 of integrated inductor set 210 can be the first end and the second end of the first inductor L1, respectively. A third port P3 and a fourth port P4 of integrated inductor set 210 can be the first end and the second end of the second inductor L2, respectively. Integrated inductor set 210, as well as the first inductor L1 and the second inductor L2, is illustrated below in more detail with reference to FIG. 3.

Figure 2B:
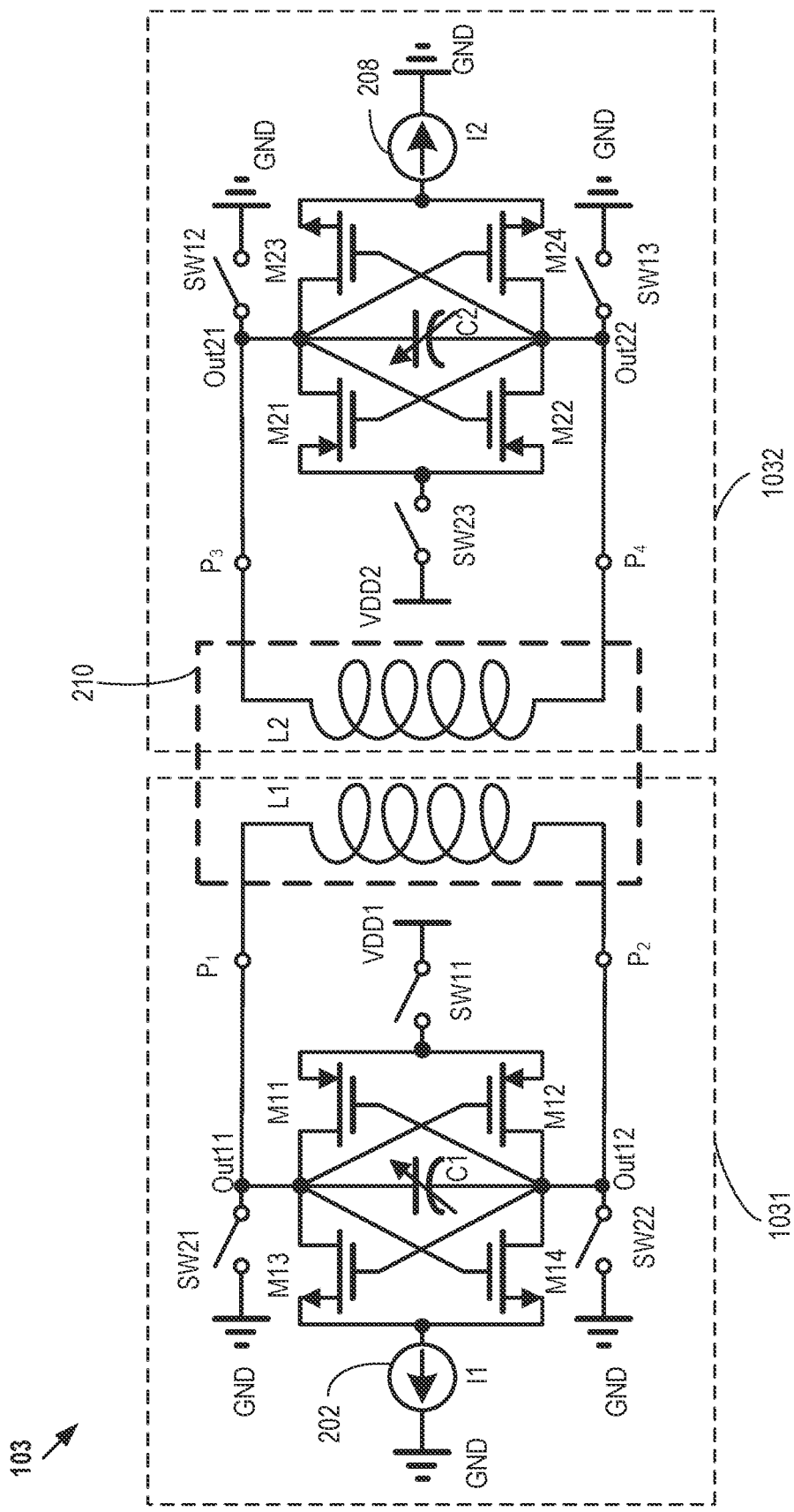
FIG. 2B illustrates an example circuit structure of the VCO in FIG. 2A, according to some aspects of the present disclosure.

FIG. 2B illustrates an example circuit structure of VCO 103 in FIG. 2A, according to some aspects of the present disclosure. The description for components similar to those of FIG. 2A will not be repeated herein. With combined reference to FIGS. 2A-2B, first oscillation core 204 may include a first control transistor M11, a second control transistor M12, a third control transistor M13, and a fourth control transistor M14. For example, the first control transistor M11, the second control transistor M12, the third control transistor M13, and the fourth control transistor M14 may be complementary metal oxide semiconductor (CMOS) transistors, such as P-type metal oxide semiconductor (PMOS) transistors or N-type metal oxide semiconductor (NMOS) transistors.

The first control transistor M11 and the second control transistor M12 may be configured as a cross-coupled switch pair. Specifically, a first end of the first control transistor M11 and a first end of the second control transistor M12 can be electrically connected to the first power supply VDD1 through the first switch of the first type SW11. A second end of the first control transistor M11 can be electrically connected to the first output end Out11 of first oscillator circuit 1031. A second end of the second control transistor M12 can be electrically connected to the second output end Out12 of first oscillator circuit 1031. A control end of the first control transistor M11 can be electrically connected to the second end of the second control transistor M12 (also connected to the second output end Out12 of first oscillator circuit 1031). A control end of the second control transistor M12 can be electrically connected to the second end of the first control transistor M11 (also connected to the first output end Out11 of first oscillator circuit 1031).

Similarly, the third control transistor M13 and the fourth control transistor M14 may be configured as a cross-coupled switch pair. Specifically, a first end of the third control transistor M13 and a first end of the fourth control transistor M14 can be electrically connected to the first current control circuit 202 (denoted as I1 in FIG. 2B), respectively. A second end of the third control transistor M13 can be electrically connected to the first output end Out11 of first oscillator circuit 1031. A second end of the fourth control transistor M14 can be electrically connected to the second output end Out12 of first oscillator circuit 1031. A control end of the third control transistor M13 can be electrically connected to the second end of the fourth control transistor M14 (also connected to the second output end Out12 of first oscillator circuit 1031). A control end of the fourth control transistor M14 can be electrically connected to the second end of the third control transistor M13 (also connected to the first output end Out12 of first oscillator circuit 1031).

Second oscillation core 206 may include a fifth control transistor M21, a sixth control transistor M22, a seventh control transistor M23, and an eighth control transistor M24. For example, the fifth control transistor M21, the sixth control transistor M22, the seventh control transistor M23, and the eighth control transistor M24 may be CMOS transistors (e.g., PMOS transistors or NMOS transistors).

The fifth control transistor M21 and the sixth control transistor M22 may be configured as a cross-coupled switch pair. Specifically, a first end of the fifth control transistor M21 and a first end of the sixth control transistor M22 can be electrically connected to the second power supply VDD2 through the third switch of the second type SW23, respectively. A second end of the fifth control transistor M21 can be electrically connected to the first output end Out21 of second oscillator circuit 1032. A second end of the sixth control transistor M22 can be electrically connected to the second output end Out22 of second oscillator circuit 1032. A control end of the fifth control transistor M21 can be electrically connected to the second end of the sixth control transistor M22 (also connected to the second output end Out22 of second oscillator circuit 1032). A control end of the sixth control transistor M22 can be electrically connected to the second end of the fifth control transistor M21 (also connected to the first output end Out21 of second oscillator circuit 1032).

Similarly, the seventh control transistor M23 and the eighth control transistor M24 may be configured as a cross-coupled switch pair. Specifically, a first end of the seventh control transistor M23 and a first end of the eighth control transistor Ms4 can be electrically connected to second current control circuit 208 (denoted as I2 in FIG. 2B), respectively. A second end of the seventh control transistor M23 can be electrically connected to the first output end Out21 of second oscillator circuit 1032. A second end of the eighth control transistor M24 can be electrically connected to the second output end Out22 of second oscillator circuit 1032. A control end of the seventh control transistor M23 can be electrically connected to the second end of the eighth control transistor M24, and a control end of the eighth control transistor M24 can be electrically connected to the second end of the seventh control transistor M23.

Figure 3:
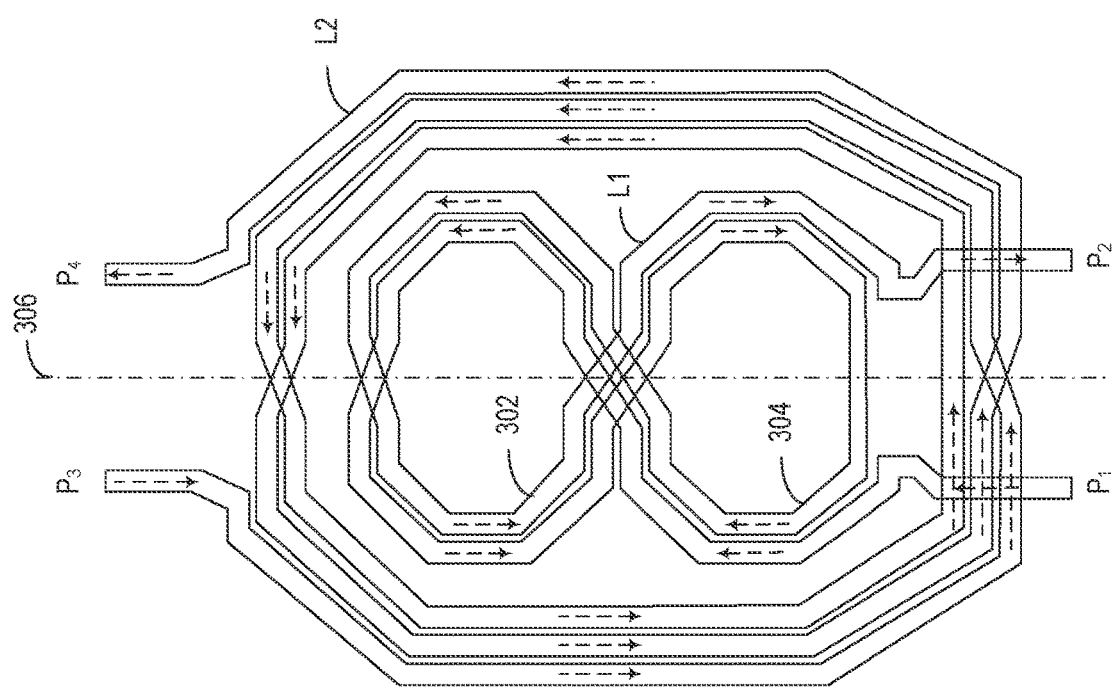
FIG. 3 illustrates example winding manners of a first inductor and a second inductor, according to some aspects of the present disclosure.

FIG. 3 illustrates example winding manners of the first inductor L1 and the second inductor L2 of FIGS. 2A-2B, according to some aspects of the present disclosure. The first inductor L1 and the second inductor L2 may form integrated inductor set 210 in which the first inductor L1 may be embedded (or nested) in the second inductor L2. The total circuit area of the two inductors L1 and L2 may be compressed into the circuit area of the second inductor L2, so that the circuit area of VCO 103 can be reduced.

The second inductor L2 may be wound in an annular shape (e.g., a ring shape). Specifically, the second inductor L2 may be wound in a shape of a polygon. For example, the second inductor L2 may be wound in a shape of a centrosymmetric octagon, as shown in FIG. 3. In another example, the second inductor L2 may be wound in a shape of a quadrangle, hexagon, or decagon, etc. In either example, the second inductor L2 may be centrally symmetric. Alternatively, the second inductor L2 may be wound in a circular or elliptical shape. It is contemplated that the second inductor L2 may have any other shape different from those disclosed herein, which is not limited herein.

The second inductor L2 may include a coil having a plurality of turns. The winding directions of the plurality of turns may be the same. For example, as illustrated in FIG. 3, the second inductor L2 may include 3 turns each of which has a counterclockwise winding direction. It is contemplated that the number of turns in the second inductor L2 may be 1, 2, 3, 4, 5, or any other suitable number, which is not limited herein. In some examples, the number of turns in the second inductor L2 may be determined based on an inductance value of the second inductor L2.

The first inductor L1 may have a centrally-symmetric shape with a center coincided with (or overlapped with) a center of the shape of the second inductor L2. In some examples, at each position of the first inductor L1, the first inductor L1 may have the same distance (or substantially the same distance) to the second inductor L2. As illustrated in FIG. 3, the first inductor L1 may be wound in a figure-of-eight shape which is embedded (or nested) inside the annular shape of the second inductor L2. Two loops 302 and 304 may be combined together to form the figure-of-eight shape of the first inductor L1. Current flow directions in loops 302 and 304 may be opposite with each other. For example, loop 302 may have a counterclockwise current flow direction, whereas loop 304 may have a clockwise current flow direction.

Each of loops 302 and 304 in the first inductor L1 may be wound in an annular shape (e.g., a ring shape). For example, each loop 302, 304 may be wound in a shape of a polygon (e.g., a centrosymmetric octagon as shown in FIG. 3, a quadrangle, a hexagon, or a decagon, etc.). In another example, each loop 302, 304 may be wound in a circular or elliptical shape. It is contemplated that each loop 302, 304 in the first inductor L1 may have any other shape different from those disclosed herein, which is not limited herein. The winding directions of loops 302, 304 may be opposite to each other. For example, the winding direction of loop 302 may be counterclockwise, whereas the winding direction of loop 304 can be clockwise.

The first inductor L1 may include a coil having a plurality of turns. For example, each loop 302, 304 may have a plurality of turns. The winding directions of the turns in the same loop may be the same, whereas the winding directions of the turns in the different loops may be different. For example, as illustrated in FIG. 3, loop 302 may include 2 turns each of which has the counterclockwise winding direction. Loop 304 may include 2 turns each of which has the clockwise winding direction. It is contemplated that the number of turns in the first inductor L2 may also be 1, 2, 3, 4, 5, or any other suitable number, which is not limited herein. In some examples, the number of turns in the first inductor L1 may be determined based on an inductance value of the first inductor L1.

As shown in FIG. 3, both the first inductor L1 and the second conductor L2 may be centrally symmetric (e.g., symmetric with respect to a center line 306) and have the same center point. With respect to the second inductor L2, when the current flows from port P3 to port P4, the current flow direction in the second inductor L2 is counterclockwise. With respect to the first inductor L1, when the current flows from port P1 to port P2, the current flow direction in the first inductor L1 is like a figure of eight. One of the two loops in the first inductor L1 may have the same current flow direction as the second inductor L2, whereas another one of the two loops in the first inductor L1 may have a current flow direction opposite to that of the second inductor L2. For example, loop 302 in the first inductor L has the same counterclockwise current flow direction as the second inductor L2, whereas loop 304 in the first inductor L1 has the clockwise current flow direction which is opposite to that of the second inductor L2. Since the current flow direction of loop 302 in the first inductance L1 is the same as the current flow direction of the second inductance L2, a mutual inductance between loop 302 and the second inductance L2 can be recorded as +M0. Since the current flow direction of loop 304 in the first inductance L1 is opposite to the current flow direction of the second inductance L2, a mutual inductance between loop 304 and the second inductance L2 can be recorded as −M0. Then, a total mutual inductance M between the first inductor L1 and the second inductor L2 can be M=+M0−M0=0. Therefore, although the first inductor L1 is embedded in the second inductor L2, a coupling coefficient k of the first and second inductors L1, L2 can be close to zero (e.g., smaller than or equal to a coupling threshold which can be zero or a value approaching zero). For example, k=M/√{l1*l2}≈0, where l1 represents the inductance value of the first inductor L1, and l2 represents the inductance value of the second inductor L2. Thus, the quality factors of the first inductor L1 and the second inductor L2 are almost unchanged even though the first and second inductors L1, L2 are embedded together, and the phase noise of VCO 103 formed with the first and second inductors L1, L2 is small.

Figure 4:
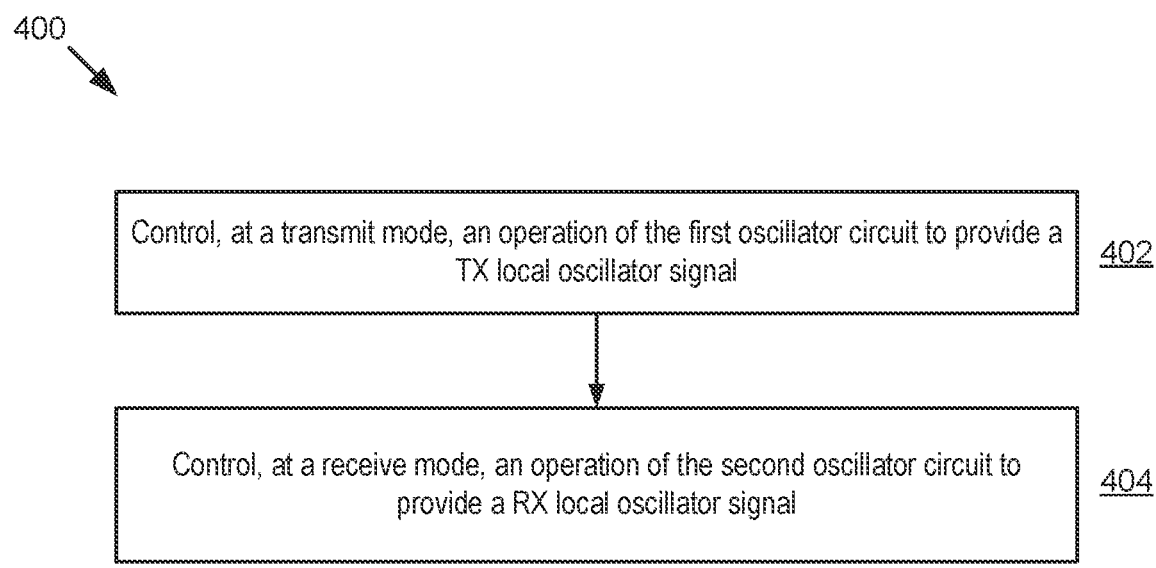
FIG. 4 illustrates a flowchart of an example control method for operating a VCO, according to some aspects of the present disclosure.

FIG. 4 illustrates a flowchart of an example control method 400 for operating a VCO (such as VCO 103), according to some aspects of the present disclosure. It is understood that the operations shown in method 400 may not be exhaustive and that other operations can be performed as well before, after, or between any of the illustrated operations. Further, some of the operations may be performed simultaneously, or in a different order than shown in FIG. 4.

Referring to FIG. 4, method 400 starts at operation 402, in which an operation of first oscillator circuit 1031 may be controlled at a transmit mode to provide a TX local oscillator signal for data transmission. The first inductor L1 can be configured to implement a first resonant frequency selection network for first oscillator circuit 1031 during the transmit mode. The first inductor L1 can be embedded inside the second inductor L2, so that a total mutual inductance between the first and second inductors L1, L2 can be smaller than or equal to a predetermined threshold. In some implementations, an operation of second oscillator circuit 1032 may be turned off at the transmit mode. An example implementation of operation 402 is illustrated below in more detail with reference to FIG. 5.

Method 400 proceeds to operation 404, as illustrated in FIG. 4, in which the operation of second oscillator circuit 1032 may be controlled at a receive mode to provide a RX local oscillator signal. The second inductor L1 can be configured to implement a second resonant frequency selection network for second oscillator circuit 1032 during the receive mode. In some implementations, the operation of first oscillator circuit 1031 may be turned off at the receive mode. An example implementation of operation 404 is illustrated below in more detail with reference to FIG. 6.

Figure 5:
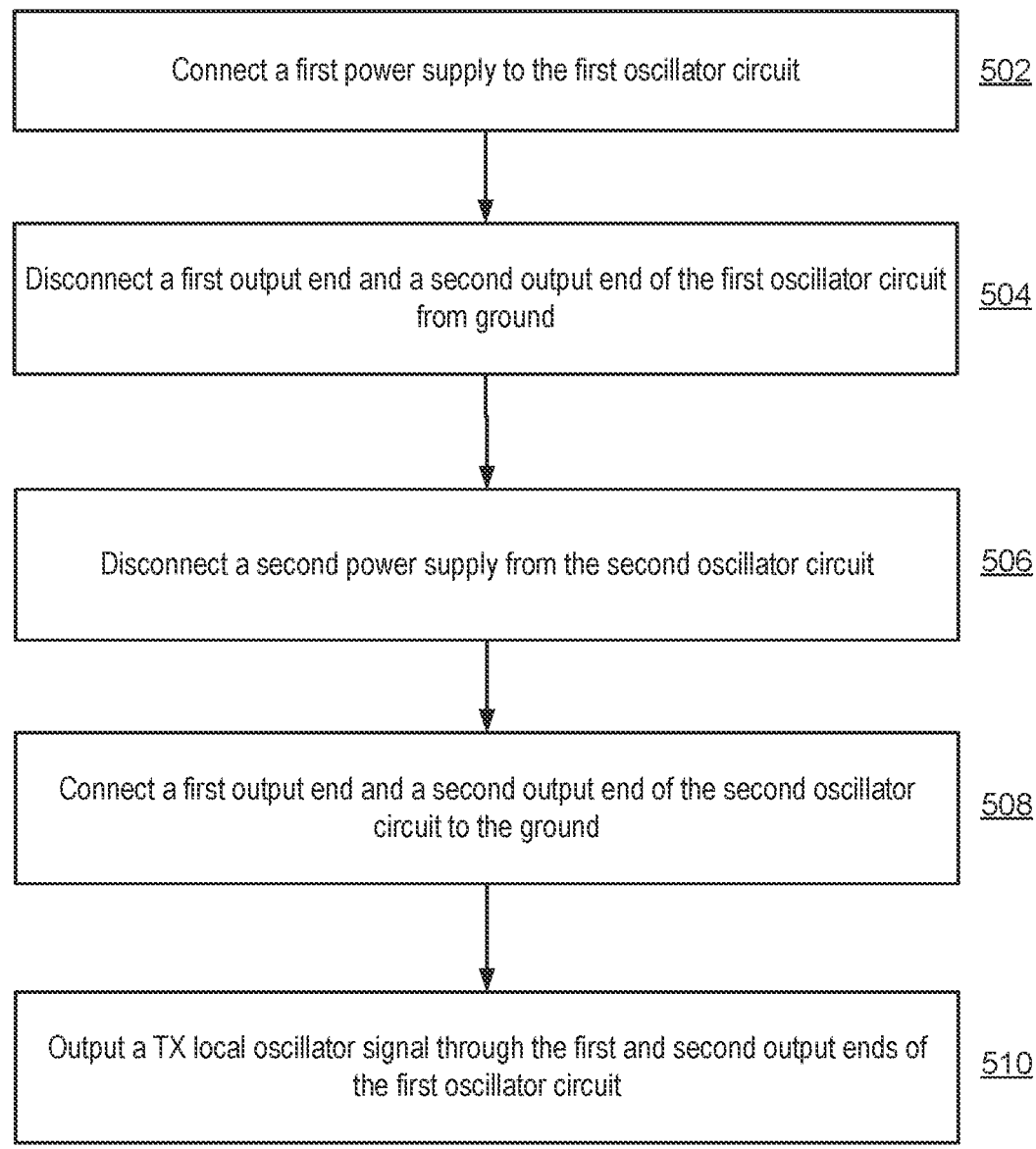
FIG. 5 illustrates a flowchart of an example method for controlling an operation of a VCO at a transmit mode, according to some aspects of the present disclosure.

FIG. 5 illustrates a flowchart of an example method 500 for controlling an operation of VCO 103 at a transmit mode, according to some aspects of the present disclosure. It is understood that the operations shown in method 500 may not be exhaustive and that other operations can be performed as well before, after, or between any of the illustrated operations. Further, some of the operations may be performed simultaneously, or in a different order than shown in FIG. 5.

At the transmit mode, only first oscillator circuit 1031 operates in a working state, whereas second oscillator circuit 1032 can be turned off. The first inductor L1 can be configured to implement a first resonant frequency selection network for first oscillator circuit 1031 during the transmit mode.

Referring to FIG. 5, method 500 starts at operation 502, in which the first power supply VDD1 is connected to first oscillator circuit 1031. For example, as illustrated in FIG. 2A or 2B, the first switch of the first type SW11 can be closed at the transmit mode, so that the first power supply VDD1 can be connected to first oscillation core 204 to provide power supply for first oscillation core 204.

Method 500 proceeds to operation 504, as illustrated in FIG. 5, in which the first output end Out11 and the second output end Out12 of first oscillator circuit 1031 are disconnected from the ground. For example, as illustrated in FIG. 2A or 2B, the first switch of the second type SW21 and the second switch of the second type SW22 can be open at the transmit mode, so that the first output end Out11 and the second output end Out12 of first oscillator circuit 1031 are disconnected from the ground.

Method 500 proceeds to operation 506, as illustrated in FIG. 5, in which the second power supply VDD2 is disconnected from second oscillator circuit 1032. For example, as illustrated in FIG. 2A or 2B, the third switch of the second type SW23 can be open at the transmit mode, so that the second power supply VDD2 is disconnected from second oscillation core 206.

Method 500 proceeds to operation 508, as illustrated in FIG. 5, in which the first output end Out21 and the second output end Out22 of second oscillator circuit 1032 are connected to the ground. For example, as illustrated in FIG. 2A or 2B, the second switch of the first type SW12 and the third switch of the first type SW13 can be closed at the transmit mode, so that the first output end Out21 and the second output end Out22 of second oscillator circuit 1032 are connected to the ground.

Method 500 proceeds to operation 510, as illustrated in FIG. 5, in which a TX local oscillator signal is output through the first and second output ends Out11, Out12 of first oscillator circuit 1031.

Figure 6:
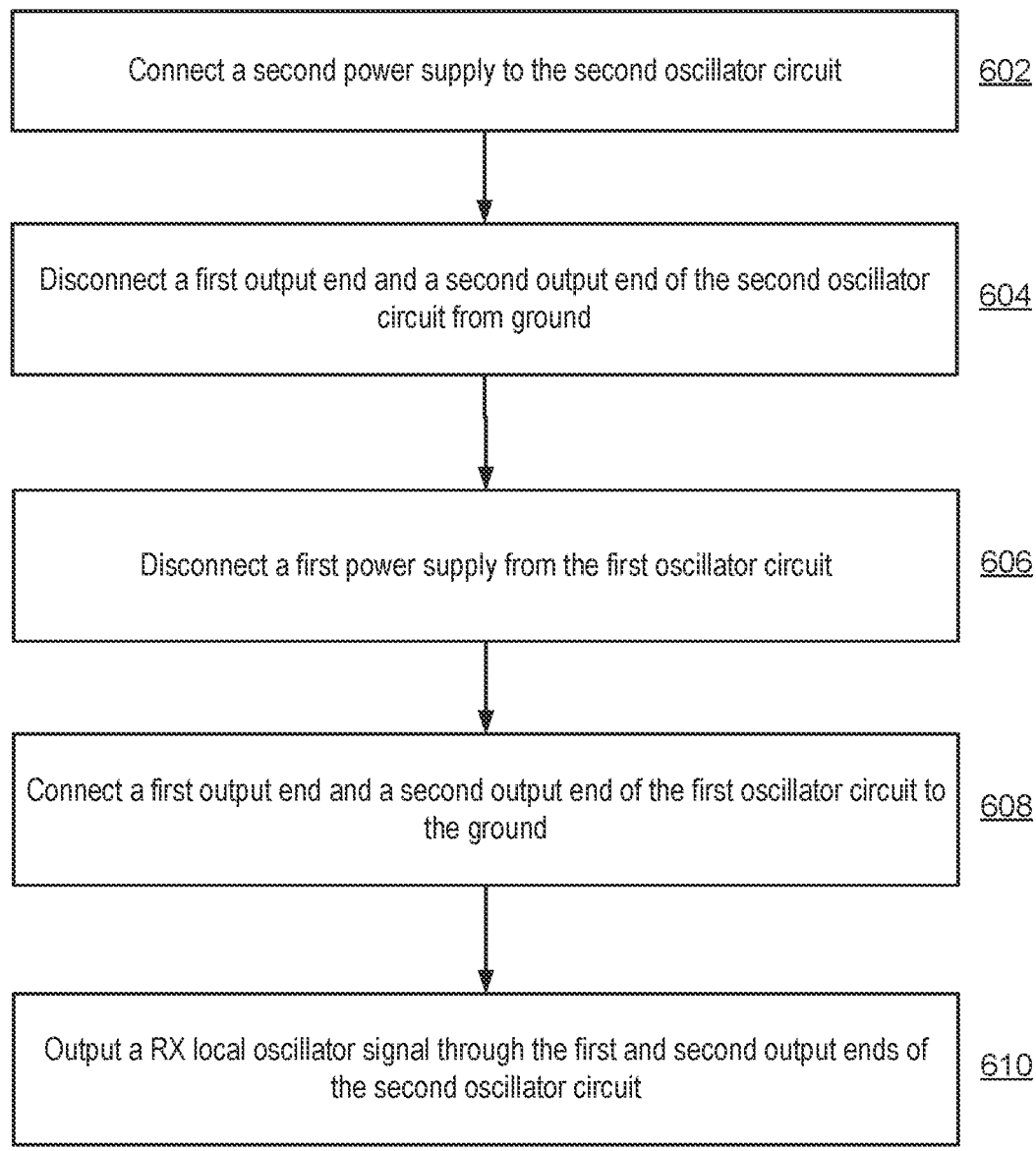
FIG. 6 illustrates a flowchart of an example method for controlling an operation of a VCO at a receive mode, according to some aspects of the present disclosure.

FIG. 6 illustrates a flowchart of an example method 600 for controlling an operation of VCO 103 at a receive mode, according to some aspects of the present disclosure. It is understood that the operations shown in method 600 may not be exhaustive and that other operations can be performed as well before, after, or between any of the illustrated operations. Further, some of the operations may be performed simultaneously, or in a different order than shown in FIG. 6.

At the receive mode, only second oscillator circuit 1032 operates in a working state, whereas first oscillator circuit 1031 can be turned off to save power so that the power consumption at the receive mode can be reduced. The second inductor L2 can be configured to implement a second resonant frequency selection network for second oscillator circuit 1032 during the receive mode.

Referring to FIG. 6, method 600 starts at operation 602, in which the second power supply VDD2 is connected to second oscillator circuit 1032. For example, as illustrated in FIG. 2A or 2B, the third switch of the second type SW23 can be closed at the receive mode, so that the second power supply VDD2 can be connected to second oscillation core 206 to provide power supply for second oscillation core 206.

Method 600 proceeds to operation 604, as illustrated in FIG. 6, in which the first output end Out21 and the second output end Out22 of second oscillator circuit 1032 are disconnected from the ground. For example, as illustrated in FIG. 2A or 2B, the second switch of the first type SW12 and the third switch of the first type SW13 can be open at the receive mode, so that the first output end Out21 and the second output end Out22 of second oscillator circuit 1032 are disconnected from the ground.

Method 600 proceeds to operation 606, as illustrated in FIG. 6, in which the first power supply VDD1 is disconnected from first oscillator circuit 1031. For example, as illustrated in FIG. 2A or 2B, the first switch of the first type SW11 can be open at the receive mode, so that the first power supply VDD1 is disconnected from first oscillation core 204.

Method 600 proceeds to operation 608, as illustrated in FIG. 6, in which the first output end Out11 and the second output end Out12 of first oscillator circuit 1031 are connected to the ground. For example, as illustrated in FIG. 2A or 2B, the first switch of the second type SW21 and the second switch of the second type SW22 can be closed at the receive mode, so that the first output end Out11 and the second output end Out12 of first oscillator circuit 1031 are connected to the ground.

Method 600 proceeds to operation 610, as illustrated in FIG. 6, in which a RX local oscillator signal is output through the first and second output ends Out21, Out22 of second oscillator circuit 1032.

According to one aspect of the present disclosure, a VCO includes a first oscillator circuit and a second oscillator circuit. The first oscillator circuit includes a first inductor. The second oscillator circuit includes a second inductor. The first inductor is embedded inside the second inductor so that a total mutual inductance between the first and second inductors is smaller than or equal to a predetermined threshold.

In some implementations, the second inductor is wound in an annular shape, and the first inductor is wound in a figure-of-eight shape nested inside the annular shape of the second inductor.

In some implementations, a first end and a second end of the first inductor are electrically coupled to a first output end and a second output end of the first oscillator circuit, respectively. A first end and a second end of the second inductor are electrically coupled to a first output end and a second output end of the second oscillator circuit, respectively.

In some implementations, the first oscillator circuit further includes a first oscillation core electrically coupled to the first output end and the second output end of the first oscillator circuit. The second oscillator circuit further includes a second oscillation core electrically coupled to the first output end and the second output end of the second oscillator circuit.

In some implementations, the first oscillator circuit further includes a first current control circuit. A first end and a second end of the first current control circuit are electrically coupled to the first oscillation core and ground, respectively. The second oscillator circuit further includes a second current control circuit. A first end and a second end of the second current control circuit are electrically coupled to the second oscillation core and the ground, respectively.

In some implementations, the first oscillation core is electrically coupled to a first power supply through a first switch of a first type. The first output end of the first oscillator circuit is electrically coupled to ground through a first switch of a second type. The second output end of the first oscillator circuit is electrically coupled to the ground through a second switch of the second type.

In some implementations, the second oscillation core is electrically coupled to a second power supply through a third switch of the second type. The first output end of the second oscillator circuit is electrically coupled to the ground through a second switch of the first type. The second output end of the second oscillator circuit is electrically coupled to the ground through a third switch of the first type.

In some implementations, the first oscillator circuit further includes a first variable capacitor connected in parallel with the first inductor. A first end and a second end of the first variable capacitor are electrically coupled to the first and second output ends of the first oscillator circuit, respectively. The second oscillator circuit further includes a second variable capacitor connected in parallel with the second inductor. A first end and a second end of the second variable capacitor are electrically coupled to the first and second output ends of the second oscillator circuit, respectively.

According to another aspect of the present disclosure, a method for controlling a VCO which includes a first oscillator circuit and a second oscillator circuit is disclosed. The first oscillator circuit includes a first inductor. The second oscillator circuit includes a second inductor. The method includes controlling, at a transmit mode, an operation of the first oscillator circuit to provide a TX local oscillator signal for data transmission. The first inductor is configured to implement a first resonant frequency selection network for the first oscillator circuit at the transmit mode. The first inductor is embedded inside the second inductor so that a total mutual inductance between the first and second inductors is smaller than or equal to a predetermined threshold. The method also includes controlling, at a receive mode, an operation of the second oscillator circuit to provide a RX local oscillator signal. The second inductor is configured to implement a second resonant frequency selection network for the second oscillator circuit at the receive mode.

In some implementations, the second inductor is wound in an annular shape, and the first inductor is wound in a figure-of-eight shape nested inside the annular shape of the second inductor.

In some implementations, a first end and a second end of the first inductor are electrically coupled to a first output end and a second output end of the first oscillator circuit, respectively. A first end and a second end of the second inductor are electrically coupled to a first output end and a second output end of the second oscillator circuit, respectively.

In some implementations, controlling, at the transmit mode, the operation of the first oscillator circuit to provide the TX local oscillator signal for data transmission includes connecting a first power supply to the first oscillator circuit, disconnecting a first output end and a second output end of the first oscillator circuit from ground, and outputting the TX local oscillator signal through the first and second output ends of the first oscillator circuit.

In some implementations, the method further includes turning off, at the transmit mode, the operation of the second oscillator circuit.

In some implementations, turning off, at the transmit mode, the operation of the second oscillator circuit includes disconnecting a second power supply from the second oscillator circuit, and connecting a first output end and a second output end of the second oscillator circuit to the ground.

In some implementations, controlling, at the receive mode, the operation of the second oscillator circuit to provide the RX local oscillator signal includes connecting the second power supply to the second oscillator circuit, disconnecting the first output end and the second output end of the second oscillator circuit from the ground, and outputting the RX local oscillator signal through the first and second output ends of the second oscillator circuit.

In some implementations, the method further includes turning off, at the receive mode, the operation of the first oscillator circuit.

In some implementations, turning off, at the receive mode, the operation of the first oscillator circuit includes disconnecting the first power supply from the first oscillator circuit, and connecting the first output end and a second output end of the first oscillator circuit to the ground.

According to yet another aspect of the present disclosure, a system circuit is disclosed. The system circuit includes a communication unit configured for data communication with an external communication network. The communication unit includes a VCO which includes a first oscillator circuit and a second oscillator circuit. The first oscillator circuit includes a first inductor. The second oscillator circuit includes a second inductor. The first inductor is embedded inside the second inductor so that a total mutual inductance between the first and second inductors is smaller than or equal to a predetermined threshold.

In some implementations, the VCO is configured to provide a TX local oscillator signal for data transmission through a first output end and a second output end of the first oscillator circuit. The VCO is configured to provide a RX local oscillator signal through a first output end and a second output end of the second oscillator circuit.

In some implementations, the second inductor is wound in an annular shape, and the first inductor is wound in a figure-of-eight shape nested inside the annular shape of the second inductor.

In some implementations, a first end and a second end of the first inductor are electrically coupled to a first output end and a second output end of the first oscillator circuit, respectively. A first end and a second end of the second inductor are electrically coupled to a first output end and a second output end of the second oscillator circuit, respectively.

In some implementations, the first oscillator circuit further includes a first oscillation core electrically coupled to the first output end and the second output end of the first oscillator circuit. The second oscillator circuit further includes a second oscillation core electrically coupled to the first output end and the second output end of the second oscillator circuit.

In some implementations, the first oscillator circuit further includes a first current control circuit, wherein a first end and a second end of the first current control circuit are electrically coupled to the first oscillation core and ground, respectively. The second oscillator circuit further includes a second current control circuit, wherein a first end and a second end of the second current control circuit are electrically coupled to the second oscillation core and the ground, respectively.

In some implementations, the first oscillation core is electrically coupled to a first power supply through a first switch of a first type. The first output end of the first oscillator circuit is electrically coupled to ground through a first switch of a second type. The second output end of the first oscillator circuit is electrically coupled to the ground through a second switch of the second type.

In some implementations, the second oscillation core is electrically coupled to a second power supply through a third switch of the second type. The first output end of the second oscillator circuit is electrically coupled to the ground through a second switch of the first type. The second output end of the second oscillator circuit is electrically coupled to the ground through a third switch of the first type.

In some implementations, the first oscillator circuit further includes a first variable capacitor connected in parallel with the first inductor. A first end and a second end of the first variable capacitor are electrically coupled to the first and second output ends of the first oscillator circuit, respectively. The second oscillator circuit further includes a second variable capacitor connected in parallel with the second inductor. A first end and a second end of the second variable capacitor are electrically coupled to the first and second output ends of the second oscillator circuit, respectively.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A voltage controlled oscillator (VCO), comprising:
   a first oscillator circuit comprising:
      a first active oscillation core electrically coupled to a first output end and a second output end of the first oscillator circuit; and
      a first inductor, wherein a first end and a second end of the first inductor are electrically coupled to the first output end and the second output end of the first oscillator circuit, respectively; and
   a second oscillator circuit comprising:
      a second active oscillation core electrically coupled to a first output end and a second output end of the second oscillator circuit; and
      a second inductor, wherein a first end and a second end of the second inductor are electrically coupled to the first output end and the second output end of the second oscillator circuit, respectively,
   wherein the first inductor is separate from the second inductor and embedded inside the second inductor,
   wherein a total mutual inductance between the first and second inductors is smaller than or equal to a predetermined coupled inductance threshold, and
   wherein the second inductor is wound in an annular shape, and the first inductor is wound in a figure-of-eight shape nested inside the annular shape of the second inductor.

2. The VCO of claim 1, wherein:
   the first oscillator circuit further comprises a first current control circuit, wherein a first end and a second end of the first current control circuit are electrically coupled to the first active oscillation core and ground, respectively; and
   the second oscillator circuit further comprises a second current control circuit, wherein a first end and a second end of the second current control circuit are electrically coupled to the second active oscillation core and the ground, respectively.

3. The VCO of claim 1, wherein:
   the first active oscillation core is electrically coupled to a first power supply through a first switch of a first type;
   the first output end of the first oscillator circuit is electrically coupled to ground through a first switch of a second type; and
   the second output end of the first oscillator circuit is electrically coupled to the ground through a second switch of the second type.

4. The VCO of claim 3, wherein:
   the second active oscillation core is electrically coupled to a second power supply through a third switch of the second type;
   the first output end of the second oscillator circuit is electrically coupled to the ground through a second switch of the first type; and
   the second output end of the second oscillator circuit is electrically coupled to the ground through a third switch of the first type.

5. The VCO of claim 1, wherein:
   the first oscillator circuit further comprises a first variable capacitor connected in parallel with the first inductor, wherein a first end and a second end of the first variable capacitor are electrically coupled to the first and second output ends of the first oscillator circuit, respectively; and
   the second oscillator circuit further comprises a second variable capacitor connected in parallel with the second inductor, wherein a first end and a second end of the second variable capacitor are electrically coupled to the first and second output ends of the second oscillator circuit, respectively.

6. A method for controlling a voltage controlled oscillator (VCO) which comprises a first oscillator circuit and a second oscillator circuit, the first oscillator circuit comprising a first inductor, the second oscillator circuit comprising a second inductor, the method comprising:
   controlling, at a transmit mode, an operation of the first oscillator circuit to provide a transmitter (TX) local oscillator signal for data transmission, wherein the first inductor is configured to implement a first resonant frequency selection network for the first oscillator circuit at the transmit mode; and
   controlling, at a receive mode, an operation of the second oscillator circuit to provide a receiver (RX) local oscillator signal for data transmission, wherein the second inductor is configured to implement a second resonant frequency selection network for the second oscillator circuit at the receive mode, wherein the first oscillator circuit further comprises a first active oscillation core electrically coupled to a first output end and a second output end of the first oscillator circuit, and a first end and a second end of the first inductor are electrically coupled to the first output end and the second output end of the first oscillator circuit, respectively, wherein the second oscillator circuit further comprises a second active oscillation core electrically coupled to a first output end and a second output end of the second oscillator circuit, and a first end and a second end of the second inductor are electrically coupled to the first output end and the second output end of the second oscillator circuit, respectively, wherein a total mutual inductance between the first and second inductors is smaller than or equal to a predetermined coupled inductance threshold, and wherein the second inductor is wound in an annular shape, and the first inductor is wound in a figure-of-eight shape nested inside the annular shape of the second inductor.

7. The method of claim 6, wherein controlling, at the transmit mode, the operation of the first oscillator circuit to provide the TX local oscillator signal for data transmission comprises:

connecting a first power supply to the first oscillator circuit;

disconnecting the first output end and the second output end of the first oscillator circuit from ground; and outputting the TX local oscillator signal through the first and second output ends of the first oscillator circuit.

8. The method of claim 7, further comprising:

turning off, at the transmit mode, the operation of the second oscillator circuit.

9. The method of claim 8, wherein turning off, at the transmit mode, the operation of the second oscillator circuit comprises:

disconnecting a second power supply from the second oscillator circuit; and connecting the first output end and the second output end of the second oscillator circuit to the ground.

10. The method of claim 9, wherein controlling, at the receive mode, the operation of the second oscillator circuit to provide the RX local oscillator signal comprises:

connecting the second power supply to the second oscillator circuit;

disconnecting the first output end and the second output end of the second oscillator circuit from the ground; and outputting the RX local oscillator signal through the first and second output ends of the second oscillator circuit.

11. The method of claim 10, further comprising:

turning off, at the receive mode, the operation of the first oscillator circuit.

12. The method of claim 11, wherein turning off, at the receive mode, the operation of the first oscillator circuit comprises:

disconnecting the first power supply from the first oscillator circuit; and connecting the first output end and the second output end of the first oscillator circuit to the ground.

13. A system circuit, comprising:

a communication unit configured for data communication with an external communication network, the communication unit comprising:

a voltage controlled oscillator (VCO), comprising:

a first oscillator circuit comprising:

a first active oscillation core electrically coupled to a first output end and a second output end of the first oscillator circuit; and a first inductor, wherein a first end and a second end of the first inductor are electrically coupled to the first output end and the second output end of the first oscillator circuit, respectively; and a second oscillator circuit comprising:

a second active oscillation core electrically coupled to a first output end and a second output end of the second oscillator circuit; and a second inductor, wherein a first end and a second end of the second inductor are electrically coupled to the first output end and the second output end of the second oscillator circuit, respectively, wherein the first inductor is separate from the second inductor and embedded inside the second inductor, wherein a total mutual inductance between the first and second inductors is smaller than or equal to a predetermined coupled inductance threshold, and wherein the second inductor is wound in an annular shape, and the first inductor is wound in a figure-of-eight shape nested inside the annular shape of the second inductor.

14. The system circuit of claim 13, wherein:

the VCO is configured to provide a transmitter (TX) local oscillator signal for data transmission through the first output end and the second output end of the first oscillator circuit; and the VCO is configured to provide a receiver (RX) local oscillator signal through the first output end and the second output end of the second oscillator circuit.

15. The VCO of claim 1, wherein the first active oscillation core comprises a first control transistor, a second control transistor, a third control transistor, and a fourth control transistor, wherein the first control transistor and the second control transistor are configured as a first cross-coupled switch pair, and wherein the third control transistor and the fourth control transistor are configured as a second cross-coupled switch pair.

16. The VCO of claim 15, wherein the second active oscillation core comprises a fifth control transistor, a sixth control transistor, a seventh control transistor, and an eighth control transistor, wherein the fifth control transistor and the sixth control transistor are configured as a third cross-coupled switch pair, and wherein the seventh control transistor and the eighth control transistor are configured as a fourth cross-coupled switch pair.

17. The system circuit of claim 13, wherein:

the first active oscillation core is electrically coupled to a first power supply; and the second active oscillation core is electrically coupled to a second power supply different from the first power supply.

* * * * *